United States Patent [19]
Fujita

[11] Patent Number: 5,392,247
[45] Date of Patent: Feb. 21, 1995

[54] SEMICONDUCTOR MEMORY DEVICE INCLUDING REDUNDANCY CIRCUIT

[75] Inventor: Koreaki Fujita, Hyogo, Japan

[73] Assignee: Mitsubishi Denki Kabushiki Kaisha, Tokyo, Japan

[21] Appl. No.: 254,448

[22] Filed: Jun. 6, 1994

Related U.S. Application Data

[63] Continuation of Ser. No. 945,179, Sep. 15, 1992, abandoned.

[30] Foreign Application Priority Data

Sep. 19, 1991 [JP] Japan ................. 3-239718

[51] Int. Cl.⁶ .................. G11C 7/00; G11C 8/00; G06F 11/00
[52] U.S. Cl. .................. 365/200; 365/230.03; 365/207; 371/10.2; 371/10.3
[58] Field of Search ............. 365/200, 189.01, 230.02, 365/230.03, 210, 207, 208, 189, 210; 371/10.2, 10.3

[56] References Cited

U.S. PATENT DOCUMENTS

| | | | |
|---|---|---|---|
| 4,406,013 | 9/1983 | Reese et al. | 377/201 |
| 4,509,147 | 4/1985 | Tanimura et al. | 365/190 |
| 4,547,867 | 10/1985 | Reese et al. | 365/189 |
| 4,601,019 | 7/1986 | Shah et al. | 365/200 |
| 4,727,516 | 2/1988 | Yoshida et al. | 365/200 |
| 4,807,191 | 2/1989 | Flannagan | 365/189 |
| 5,021,944 | 6/1991 | Sasaki et al. | 365/200 |
| 5,060,197 | 10/1991 | Park et al. | 365/200 |
| 5,126,973 | 6/1992 | Gallia et al. | 365/200 |
| 5,163,023 | 11/1992 | Ferris et al. | 365/200 |

FOREIGN PATENT DOCUMENTS

| | | |
|---|---|---|
| 60-130139 | 7/1985 | Japan . |
| 62-153700 | 9/1987 | Japan . |
| 62-217498 | 9/1987 | Japan . |
| 1-276496 | 11/1989 | Japan . |
| 2-177088 | 7/1990 | Japan . |
| 3-80500 | 4/1991 | Japan . |
| 3-93097 | 4/1991 | Japan . |

*Primary Examiner*—William L. Sikes
*Assistant Examiner*—Tiep H. Nguyen
*Attorney, Agent, or Firm*—Lowe, Price, LeBlanc & Becker

[57] ABSTRACT

An addressing system of redundancy word lines is provided independently of an addressing system of word lines in memory cell array blocks. Outputs of substitution circuits including redundancy selecting circuits and substitute address program circuits are applied as redundancy word line activating signals directly to the redundancy word lines not through decoders, respectively. An output of a normal memory cell nonselecting circuit is applied as a decoder inactivating signal to the decoders.

14 Claims, 8 Drawing Sheets

SEMICONDUCTOR MEMORY DEVICE INCLUDING REDUNDANCY CIRCUIT

This application is a continuation of application Ser. No. 07/945,179, filed Sep. 15, 1992, now abandoned.

BACKGROUND OF THE INVENTION

1. Field of the Invention

The present invention relates generally to semiconductor memory devices and, more particularly, to a semiconductor memory device including a redundancy circuit.

2. Description of the Background Art

In order to increase production yield of semiconductor memory devices, semiconductor memory devices incorporating redundancy circuits have been developed. With use of a redundancy circuit, when a certain word line of a semiconductor memory device or memory cells connected to that word line has any defects, that word line can be replaced with a redundancy word line. Accordingly, the defective word line or defective memory cells can be rescued.

FIG. 7 is a diagram showing structure of a major portion of a conventional semiconductor memory device including a redundancy circuit.

A memory array 1 includes a plurality of word lines WL, a plurality of bit line pairs BL intersecting the plurality of word lines WL, and a plurality of memory cells MC provided at intersections of the word lines and the bit lines. The memory array 1 further includes a redundancy word line RWL. The memory cells MC are also connected to the redundancy word line RWL.

The memory array 1 is connected with a decoder 2 and a sense amplifier unit 13. The sense amplifier unit 13 includes a plurality of sense amplifiers and a plurality of transfer gates connected to the plurality of bit line pairs BL, and a decoder.

This semiconductor memory device incorporates a substitution circuit 10. The substitution circuit 10 includes a redundancy selecting circuit 3, a substitute address program circuit 4 and a NAND circuit 5. The substitution circuit 10 and the redundant word line RWL constitute the redundancy circuit.

An operation of the semiconductor memory device of FIG. 7 will now be described. The decoder 2 responds to an X address signal XA to select one of the plurality of word lines WL in the memory array 1 and raises a potential of the selected word line WL to a logic high level (or a "H" level). Accordingly, data are read from memory cells MC connected to that word line WL to their corresponding bit line pairs BL. amplifiers included in the sense amplifier unit 13. respond to a Y address signal YA to turn one of the plurality of transfer gates on. The data are amplified by the sense amplifiers included in the sense amplifier unit 13. Consequently, one data is output.

When a certain word line WL has some associated defect, the redundancy word line RWL is used in place of the defective word line WL. In that case, an output of the redundancy selecting circuit 3 attains a logic high level. In addition, an address of a word line WL to be substituted is programmed in the substitute address program circuit 4.

When an address designated by the X address signal XA matches the address programmed in the substitute address program circuit 4, i.e., the substitute address, an output of the substitute address program circuit 4 attains a logic high level. When outputs of the redundancy selecting circuit 3 and the substitute address program circuit 4 attain a logic high level, an output of the NAND circuit 5 (a decoder inactivation signal DA) attains a logic low level (or a "L" level). This renders the decoder 2 inactive and brings all the word lines WL in a nonselection state. In addition, the potential of the redundancy word line RWL rises to a logic high level.

In such a manner, if the defective word line WL or the word line WL connected to defective memory cells is selected, then the redundancy word line RWL is selected in place of the selected word line WL.

While the memory array 1 includes a redundancy bit line pair in some case, such a redundancy bit line pair is omitted from FIG. 7.

FIG. 8 is a circuit diagram showing a detailed structure of the redundancy selecting circuit 3. The redundancy selecting circuit 3 includes a fuse 31, a MOS capacitor 32, a high resistor 33, P channel transistors 34 and 35, and an N channel transistor 36.

In a normal state, i.e., where the redundancy word line RWL is not used (redundancy nonselection time), the fuse 31 is in a connection state. Thus, a potential on a node N1 is at a ground level, and a signal of a logic low level is input to the NAND circuit 5 of FIG. 7. Consequently, the decoder inactivation signal DA attains a logic high level, and the potential of the redundancy word line RWL does not rise.

When the redundancy word line RWL is used (redundancy selection time), the fuse 1 is cut off. When a power supply is turned on, the potential on the node N1 rises toward a logic high level because of a current flowing through the high resistor 33 in a case where a supply voltage rises gradually, while the potential on the node N1 rises toward a logic high level because of a capacitance coupling by the MOS capacitor 32 in a case where the supply voltage rises sharply. Further, a positive feedback circuit comprised of the transistors 34, 35 and 36 causes the potential on the node N1 to attain a complete logic high level.

In such a manner, the output of the redundancy selecting circuit 3 attains a logic low level at the redundancy nonselection time, while the output thereof attains a logic high level at the redundancy selection time.

FIG. 9 shows a circuit diagram showing a detailed configuration of the substitute address program circuit 4. A circuit part A includes a fuse 41, a MOS capacitor 42, a high resistor 43, P channel transistors 44 and 45, and an N channel transistor 46. A circuit part B includes a fuse 51, a MOS capacitor 52, a high resistor 53, P channel transistors 54 and 55, and an N channel transistor 56. A structure and operation of the circuit parts A and B is identical to that of the redundancy selecting circuit 3 of FIG. 8.

Thus, a potential on a node N3 in the circuit part A attains a logic low level when the fuse 41 is in a connection state, while the potential on the node N3 attains a logic high level when the fuse 41 is cut off. Similarly, a potential on a node N5 in the circuit part B attains a logic low level when the fuse 51 is in a connection state, while the potential on the node N5 attains a logic high level when the fuse 51 is cut off.

P channel transistors 61 and 62 and N channel transistors 71 and 72 are connected between an input terminal I1 and an output terminal O1. P channel transistors 63 and 64 and N channel transistors 73 and 74 are connected between an input terminal I2 and the output terminal O1. P channel transistors 65 and 66 and N channel transistors 75 and 76 are connected between an input terminal I3 and the output terminal O1. P channel transistors 67 and 68 and N channel transistors 77 and 78 are connected between an input terminal I4 and the output terminal O1.

Respective gates of the transistors 61, 73, 65 and 77 are connected to the node N3 in the circuit part A, while respective gates of the transistors 71, 63, 75 and 67 are connected to a node N4 in the circuit part A. Respective gates of the transistors 62, 64, 76 and 78 are connected to the node N5 in the circuit part B, while respective gates of the transistors 72, 74, 66 and 68 are connected to a node N6 in the circuit part B.

The substitute address program circuit 4 shown in FIG. 9 is a program circuit for X address signals X0 and X1. Description will now be made on a program method in this program circuit.

First, predecode signals X0.X1, X0.X1, X0.X1 and X0.X1 are defined as follows:

X0.X1="H" (i.e., a logic high level) where X0="H", X1="H";

X0.X1="H" where X0="H", X1="L" (i.e., a logic low level);

X0.X1="H" where X0="L", X1="H"; and

X0.X1="H" where X0="L", X1="L".

Each of the predecode signals X0.X1, X0.X1, X0.X1 and X0.X1 attains a logic low level except for the foregoing conditions.

Assume that the input terminal I1 is coupled with the predecode signal X0.X1, the input terminal I2 with the predecode signal X0.X1, the input terminal I3 with the predecode signal X0.X1, and the input terminal I4 with the predecode signal X0.X1.

When the fuses 41 and 51 are in a connection state, only the input terminal I1 is connected to the output terminal O1. Accordingly, the predecode signal X0.X1 appears on the output terminal O1. An output attains a logic high level when X0="H", X1="H". Since the redundancy word line RWL is selected at that time, an address of X0=X1="H" is programmed into the substitute address program circuit 4 by the fuses 41 and 51.

Similarly, when the fuse 41 is cut off and the fuse 51 is in a connection state, the predecode signal X0.X1 appears on the output terminal O1. Thus, an address of X0="H", X1="L" is programmed. When the fuse 41 is in a connection state and the fuse 51 is cut off, the predecode signal X0.X1 appears on the output terminal O1. Thus, an address of X0="L", X1="H" is programmed. When both the fuses 41 and 51 are cut off, the predecode signal X0.X1 appears on the output terminal O1. Thus, an address of X0=X1="L" is programmed.

Since the number of X address signals is normally two or more, the circuits shown in FIG. 9 are provided in a plural number and an output of each circuit is input to the NAND gate 5 of FIG. 7.

When the memory array 1 is divided into a plurality of memory blocks, a redundancy word line RWL is provided in each memory block. In this case, if there is only one substitution circuit 10 shown in FIG. 7, then only one defect is rescued despite the fact that there are redundancy word lines RWL corresponding in number to the memory blocks.

Thus, when the memory array 1 is divided into a plurality of memory blocks, one substitution circuit 10 is provided for each memory block. As a result, a word line WL in each memory block is replaced by a redundancy word line RWL in the same memory block by its corresponding substitution circuit 10. However, at most two redundancy word lines may be provided in each memory block.

As described above, in the semiconductor memory device including the conventional redundancy circuit, defective memory cells (defective bits) must be replaced by at most two redundancy word lines and redundant bit line pairs provided in one memory block, for rescue of the defective bits.

As a pattern for formation of memory cells becomes more miniaturized, it more frequently occurs that one defect makes a plurality of memory cells defective. It is difficult for at most two redundancy word lines and redundancy bit line pairs to rescue multi-bit defects extending two-dimensionally.

As has been described heretofore, the semiconductor memory device including the conventional redundancy circuit has the disadvantage that the device is not capable of handling an increase of multi-bit defects with miniaturization of the transistor formation pattern.

SUMMARY OF THE INVENTION

One object of the present invention is to obtain a semiconductor memory device including a redundancy circuit capable of rescuing multi-bit defects extending two-dimensionally.

Another object of the present invention is to obtain a semiconductor memory device for enabling substitution of a defective bit by an arbitrary redundancy selecting line independently of a memory cell array block.

A further object of the present invention is to enable an effective substitution of defective bits in a large number of memory cell array blocks by a small number of redundancy circuits.

A semiconductor memory device according to the present invention includes a plurality of memory cell array blocks, a plurality of first selecting circuits, a plurality of redundancy selecting lines, a plurality of redundancy memory cells, a plurality of redundancy circuits, and an inactivation circuit. Each of the plurality of memory cell array blocks includes a plurality of selecting lines and a plurality of memory cells connected to those selecting lines. The plurality of first selecting circuits are provided corresponding to the plurality of memory cell array blocks, and each of the first selecting circuits selects any of the plurality of selecting lines in its corresponding memory cell array block. The plurality of redundancy selecting lines are provided corresponding to a predetermined plurality of memory cell array blocks. The plurality of redundancy memory cells are connected to the plurality of redundancy selecting lines.

Each of the plurality of redundancy circuits corresponds to one or plurality of redundancy selecting lines. Each of the plurality of redundancy circuits includes a setting circuit in which information as to whether or not a corresponding one or plurality of redundancy selecting lines are used is set in advance, a program circuit in which an address of a selecting line which is to be substituted by a corresponding one or plurality of redundancy selecting lines can be programmed, and a second selecting circuit responsive to outputs of the setting circuit and the program circuit for selecting one or a plurality of redundancy selecting lines.

The inactivation circuit responds to outputs of the plurality of redundancy circuits to inactivate the plurality of first selecting circuits when one or a plurality of redundancy selecting lines are selected by any of the plurality of redundancy circuits.

In that semiconductor memory device, an addressing system of the redundancy selecting lines is provided separately from that of the selecting lines in the memory cell array blocks, and selection of any of the redundancy selecting lines is made by the second selecting circuits provided separately from the first selecting circuits. This enables an address of a selecting line in an arbitrary memory cell array block to be programmed into the program circuit in each redundancy circuit. Accordingly, a defective bit in a certain memory cell array block can be substituted by an arbitrary redundancy selecting line independently of the memory cell array block.

This makes it possible to effectively substitute multibit defects extending two-dimensionally with pattern miniaturization by an arbitrary plurality of redundancy selecting lines.

In that semiconductor memory device, a selecting line in each memory cell array block can be substituted by an arbitrary redundancy selecting line, and all the first selecting lines are simultaneously inactivated by the inactivation means upon selection of the redundancy selecting line. It is thus unnecessary to provide redundancy circuits or redundancy selecting lines by the same number as the number of memory cell array blocks.

Accordingly, in a semiconductor memory device having a large number of memory cell array blocks also, a circuit scale and a chip area can be reduced by decreasing the number of redundancy circuits and redundancy selecting lines.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
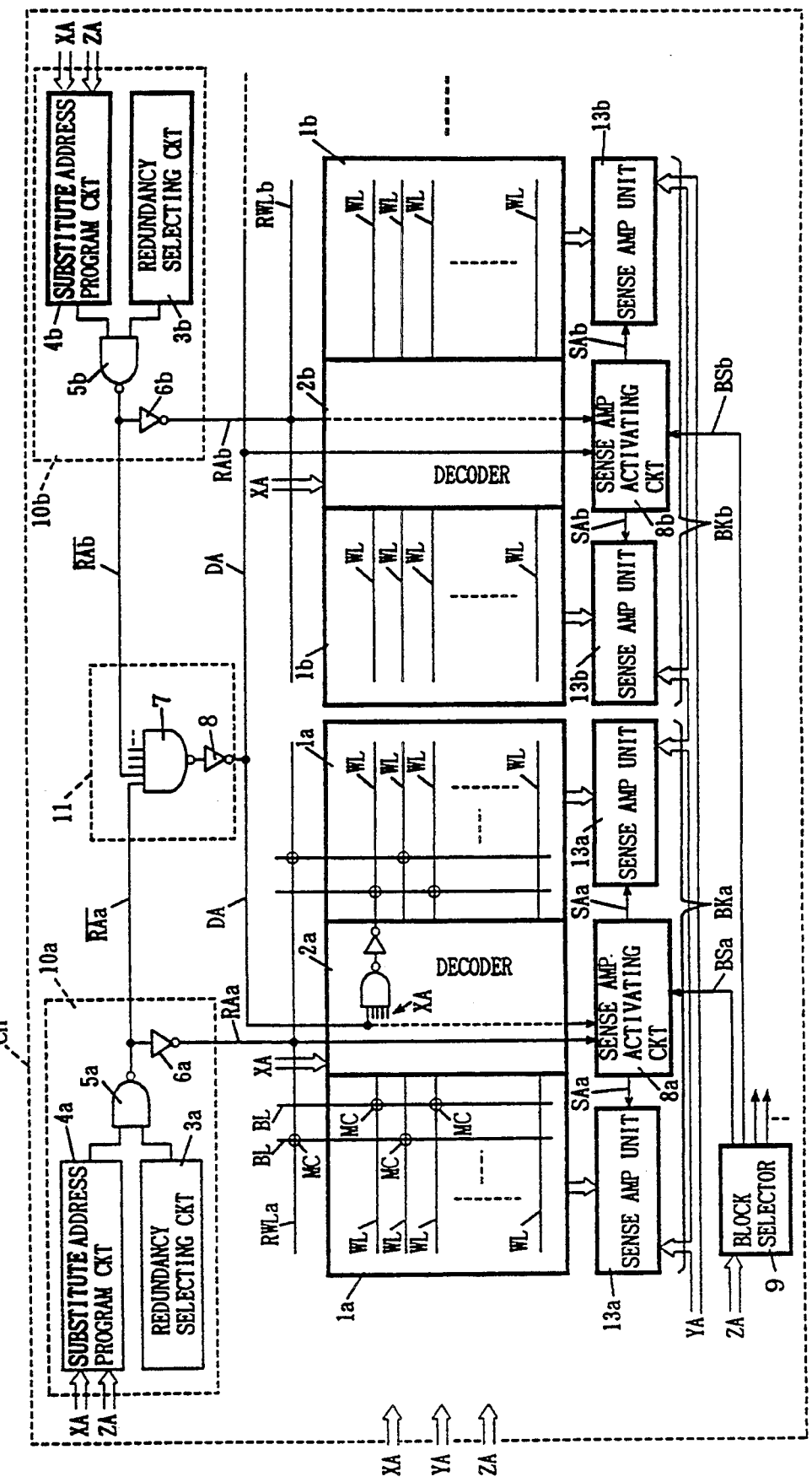
FIG. 1 is a block diagram showing structure of a semiconductor memory device including a redundancy circuit according to one embodiment of the present invention.

Embodiments of the present invention will now be described in detail with reference to the drawings. FIG. 1 is a block diagram showing structure of a semiconductor memory device including a redundancy circuit according to one embodiment of the present invention. This semiconductor memory device is formed on a chip CH. The device includes a plurality of memory blocks. Only two memory blocks BKa and BKb are shown in FIG. 1. The memory block BKa includes a memory cell array block 1a, a decoder 2a, a sense amplifier unit 13a and a sense amplifier activating circuit 8a. Similarly, the memory block BKb includes a memory cell array block 1b, a decoder 2b, a sense amplifier unit 13b and a sense amplifier activating circuit 8b.

Each of the memory cell array blocks 1a and 1b includes a plurality of word lines WL, a plurality of bit line pairs BL, and a plurality of memory cells MC provided at intersections of the word lines and the bit lines. Each of the sense amplifier units 13a and 13b includes a plurality of sense amplifiers and transfer gates connected to the plurality of bit line pairs BL, and a decoder and a write driver.

A substitution circuit 10a and a redundancy word line RWLa are provided corresponding to the memory block BKa, while a substitution circuit 10b and a redundancy word line RWLb are provided corresponding to the memory block BKb. The redundancy word lines RWLa and RWLb are also connected with memory cells MC.

The substitution circuit 10a includes a redundancy selecting circuit 3a, a substitute address program circuit 4a, a NAND circuit 5a and an inverter 6a. Similarly, the substitution circuit 10b includes a redundancy selecting circuit 3b, a substitute address program circuit 4b, a NAND circuit 5b and an inverter 6b.

Figure 7:
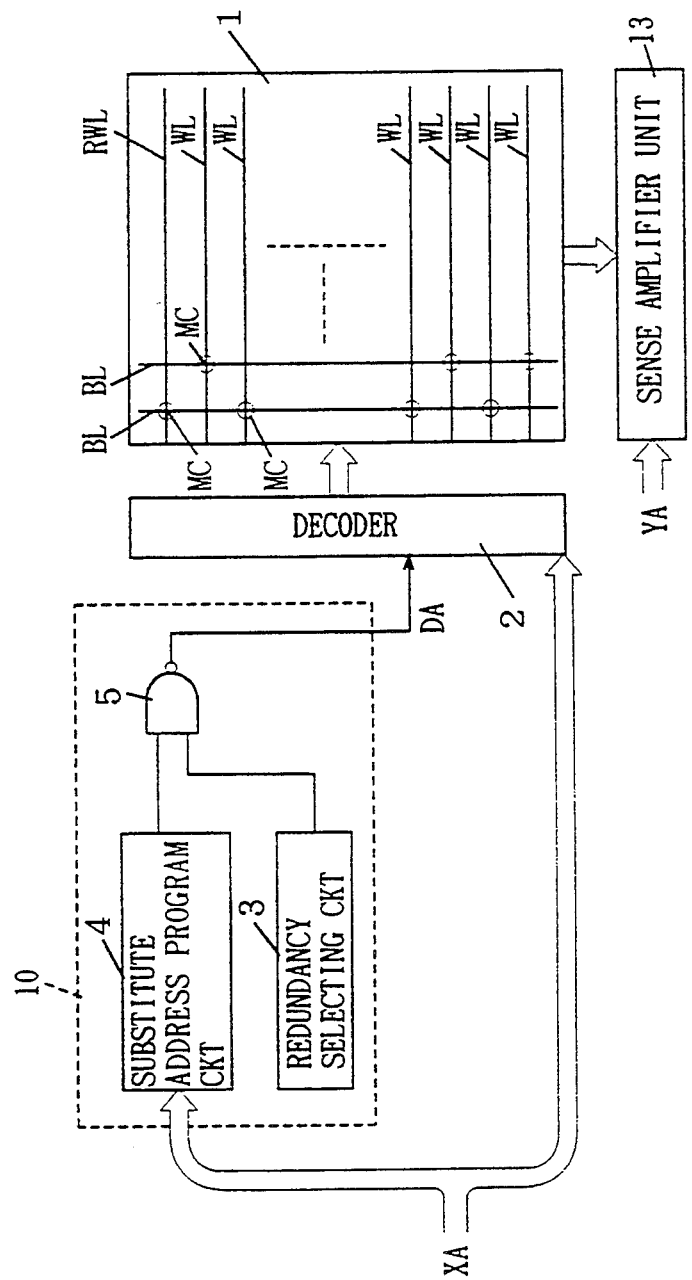
FIG. 7 is a diagram showing structure of a major portion of a semiconductor memory device including a conventional redundancy circuit.
Figure 8:
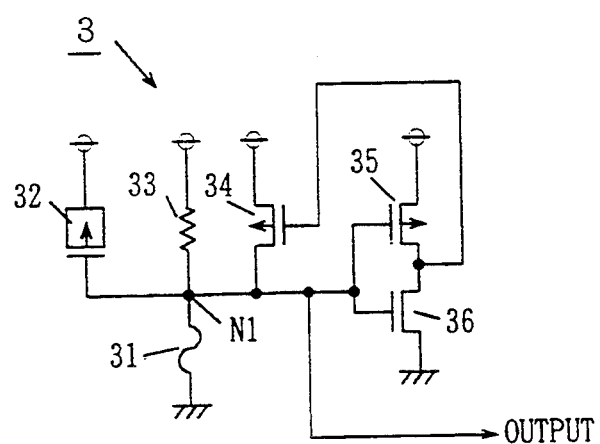
FIG. 8 is a circuit diagram showing a detailed structure of a redundancy selecting circuit.
Figure 9:
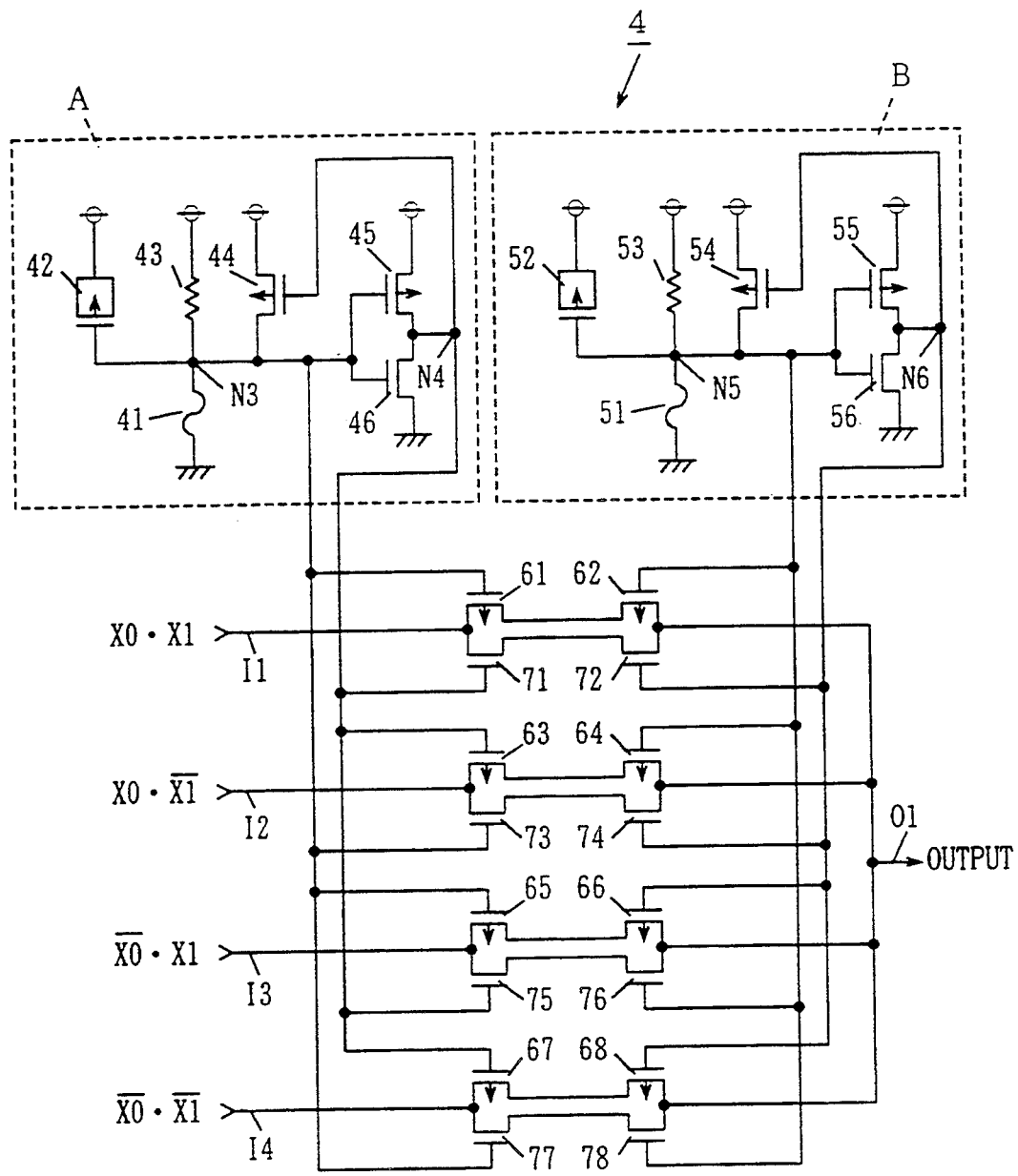
FIG. 9 is a circuit diagram showing a detailed structure of a substitute address program circuit.

The substitution circuit 10a and the redundancy word line RWLa constitute a redundancy circuit corresponding to the memory block BKa, while the substitution circuit 10b and the redundancy word line RWLb constitute a redundancy circuit corresponding to the memory block BKb. A structure and operation of each redundancy selecting circuit 3a, 3b is identical to that of the redundancy selecting circuit 3 shown in FIG. 7. A structure and operation of each substitute address program circuit 4a, 4b is identical to that of the substitute address program circuit 4 shown in FIG. 8.

Further, a normal memory cell nonselecting circuit 11 is provided in common to all the memory blocks BKa and BKb. The normal memory cell nonselecting circuit 11 includes a NAND circuit 7 and an inverter 8.

Each of the decoders 2a and 2b is supplied with an externally applied X address signal XA, each of the substitute address program circuits 4a and 4b with an X address signal XA and an externally applied Z address signal (block address signal) ZA, and each of the sense amplifiers 13a and 13b with an externally applied Y address signal YA. The block selector 9 is supplied with a Z address signal ZA.

Outputs of the redundancy selecting circuit 3a and the substitute address program circuit 4a are applied to input terminals of the NAND circuit 5a, and an output signal $\overline{RAa}$ of the NAND circuit 5a is applied to one of input terminals of the NAND circuit 7 of the normal memory cell nonselecting circuit 11 and to the inverter 6a. An output of the inverter 6a is applied as a redundancy word line activating signal RAa to the redundancy word line RWLa and the sense amplifier activating circuit 8a.

Similarly, outputs of the redundancy selecting circuit 3b and the substitute address program circuit 4b are applied to input terminals of the NAND circuit 5b, and an output signal $\overline{RAb}$ of the NAND circuit 5b is applied to another input terminal of the NAND circuit 7 of the normal memory cell nonselecting circuit 11 and to the inverter 6b. An output of the inverter 6b is applied as a redundancy word line activating signal RAb to the redundancy word line RWLb and the sense amplifier activating circuit 8b.

When there is at least one output of each of the substitute address program circuits 4a and 4b, at least two input terminals of each of the NAND circuits 5a and 5b are required.

An output of the normal memory cell nonselecting circuit 11 is applied as a decoder inactivating signal DA to the decoders 2a and 2b and the sense amplifier activating circuits 8a and 8b. The sense amplifier activating circuit 8a responds to a block selecting signal BSa, the redundancy word line activating signal RAa and the decoder inactivating signal DA to apply a sense amplifier activating signal SAa to the sense amplifier unit 13a. Similarly, the sense amplifier activating circuit 8b responds to a block selecting signal BSb, the redundancy word line activating signal RAb and the decoder inactivating signal DA to apply a sense amplifier activating signal SAb to the sense amplifier unit 13b.

Figure 2:
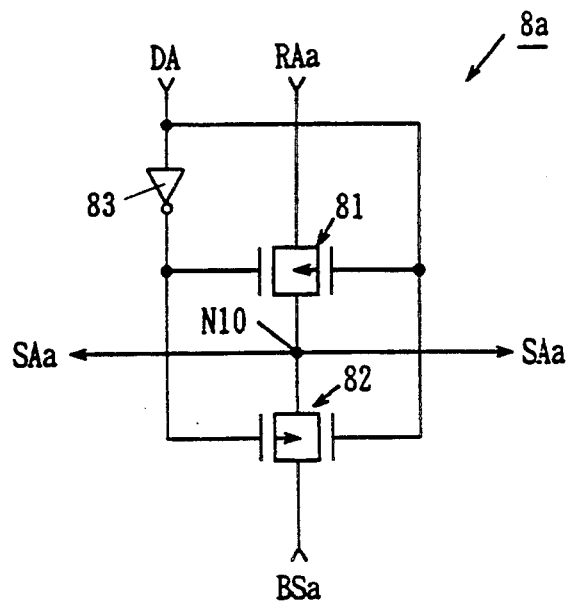
FIG. 2 is a circuit diagram showing structure of a sense amplifier activating circuit.

FIG. 2 shows a detailed circuit configuration of the sense amplifier activating circuit 8a. The sense amplifier activating circuit 8a includes CMOS transfer gates 81 and 82 and inverters 83.

When the decoder inactivating signal DA is at a logic low level, the CMOS transfer gate 81 is turned on and the CMOS transfer gate 82 is turned off. Accordingly, the redundancy word line activating signal RAa is output as the sense amplifier activating signal SAa from a node N10. When decoder inactivating signal DA is at a logic high level, the CMOS transfer gate 81 is turned off and the CMOS transfer gate 82 is turned on. Accordingly, the block selecting signal BSa is output as the sense amplifier activating signal SAa from the node N10.

A structure and operation of the sense amplifier activating circuit 8b is identical to that of the sense amplifier activating circuit 8a.

Figure 3:
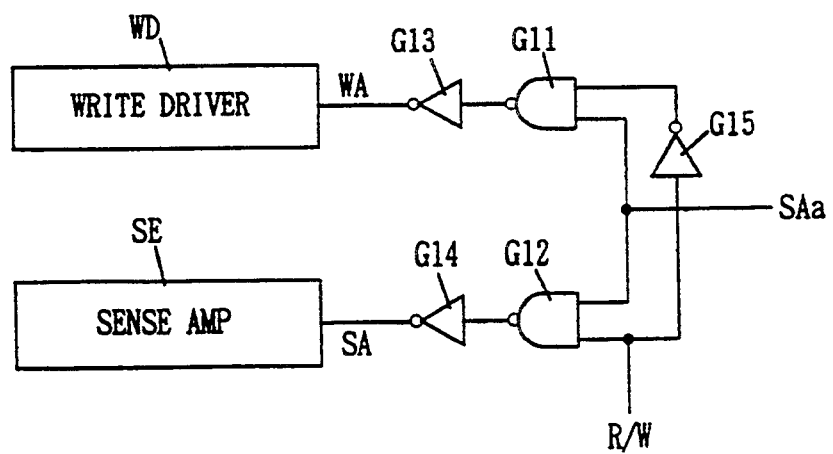
FIG. 3 is a diagram showing structure of a part of a sense amplifier unit.

FIG. 3 shows structure of a part of the sense amplifier unit 13a.

The sense amplifier activating signal SAa is applied to one input terminal of a NAND circuit G11 and one input terminal of a NAND circuit G12. The other input terminal of the NAND circuit G11 is supplied with a read/write control signal R/W via an inverter G15, and the other input terminal of the NAND circuit G12 is directly supplied with the read/write control signal R/W. An output signal of an inverter G13 is applied as a write driver activating signal WA to a write driver WD. An output signal of an inverter G14 is applied as a sense amplifier activating signal SA to a sense amplifier SE.

In a reading operation, the read/write control signal R/W attains a logic high level. If the sense amplifier activating signal SAa is at a logic high level, the sense amplifier activating signal SA attains a logic high level. This renders the sense amplifier SE active. In a writing operation, the read/write control signal R/W attains a logic low level. If the sense amplifier activating signal SAa is at a logic high level, the write driver activating signal WA attains a logic high level. This renders the write driver WD active.

An operation of the semiconductor memory device of FIG. 1 will now be described.

When all the redundancy word lines RWLa and RWLb are not in use (the redundancy nonselecting time), outputs of the redundancy selecting circuits 3a and 3b attain a logic low level and outputs of the NAND circuits 5a and 5b attain a logic high level. Accordingly, the redundancy word line activating signals RAa and RAb attain a logic low level, and the decoder inactivating signal DA attains a logic high level. This renders the decoders 2a and 2b active. The block selecting signals BSa and BSb are output as sense amplifier activating signals SAa and SAb from the sense amplifier activating circuits 8a and 8b, respectively.

If the memory block BKa is designated by the Z address signal ZA, for example, the block selecting signal BSa attains a logic high level and the block selecting signal BSb attains a logic low level. Accordingly, the sense amplifier unit 13a is rendered active, while the sense amplifier unit 13b is rendered inactive. The decoder 2a responds to the X address signal XA to select one of the plurality of word lines WL in the memory cell array block 1a and raises its potential to a logic high level. Accordingly, data are read from the memory cells MC connected to that selected word line WL to its corresponding bit line pair BL.

In a reading operation, the read data are amplified by the sense amplifiers included in the sense amplifier unit 13a. The decoder included in the sense amplifier unit 13a responds to the Y address signal YA to turn one of the plurality of transfer gates on. As a result, one data is output. Since the redundancy word line activating signals RAa and RAb are at a logic low level at that time, no redundancy word lines RWLa and RWLb are selected.

When either the redundancy word line RWLa or RWLb is in use (the redundancy selection time), an output of either the redundancy selecting circuit 3a or 3b attains a logic high level. Assume that the redundancy word line RWLa is in use, for example. In that case, the output of the redundancy selecting circuit 3a attains a logic high level.

An address of a word line WL to be substituted (substitute address) is programmed into the substitute address program circuit 4a. Not only an address of a word line WL in the memory block BKa but also an address of a word line WL in the other memory block BKb can be programmed into the substitute address program circuit 4a.

When the address designated by the X address signal XA and the Z address signal ZA does not match the substitute address programmed into the substitute address program circuit 4a, the output of the substitute address program circuit 4a attains a logic low level, and the output signal $\overline{RAa}$ of the NAND circuit 5a attains a logic high level. In that case, the word line WL in the memory cell array block 1a or 1b is selected and data is read by the same operation as at the redundancy nonselection time.

On the other hand, when the address designated by the X address signal XA and the Z address signal ZA matches the substitute address programmed into the substitute address program circuit 4a, the output of the substitute address program circuit 4a attains a logic high level and the output signal $\overline{RAa}$ of the NAND circuit 5a attains a logic low level. This causes the decoder inactivating signal DA to attain a logic low level and renders the decoders 2a and 2b inactive. Thus, the word line WL in the memory cell array block 1a or 1b is not selected.

Also, the redundancy word line activating signal RAa attains a logic high level, so that the potential of the redundancy word line RWLa rises to a logic high level. Accordingly, data are read from the memory cells MC connected to the redundancy word line RWLa onto its corresponding bit line pair BL.

Further, the redundancy word line activating signal RAa is applied as the sense amplifier activating signal SAa from the sense amplifier activating circuit 8a to the sense amplifier unit 13a. This renders the sense amplifier unit 13a active.

The decoder included in the sense amplifier unit 13a responds to the Y address signal YA to turn one of the plurality of transfer gates on. Accordingly, the data read onto the bit line pair BL are amplified by the sense amplifiers included in the sense amplifier unit 13a. Accordingly, one data is output.

When a defective bit is substituted by a redundancy word line, i.e., the address designated by the X address signal XA and the Z address signal ZA matches the programmed substitute address, selection of the redundancy word line is made independently of any block selecting signal. At that time, all the memory cell array blocks are rendered inactive irrespective of the selection of the redundancy word line. This allows a defective bit to be substituted by a redundancy word line in a different memory block.

While the reading operation has been described in the foregoing embodiment, the redundancy circuit is operative in a writing operation in totally the same manner as in the reading operation by use of a write driver in place of a sense amplifier.

Further, while the present invention is applied to a redundancy word line in the foregoing embodiment, the present invention is also applicable to a redundancy bit line pair in the same manner.

Figure 4:
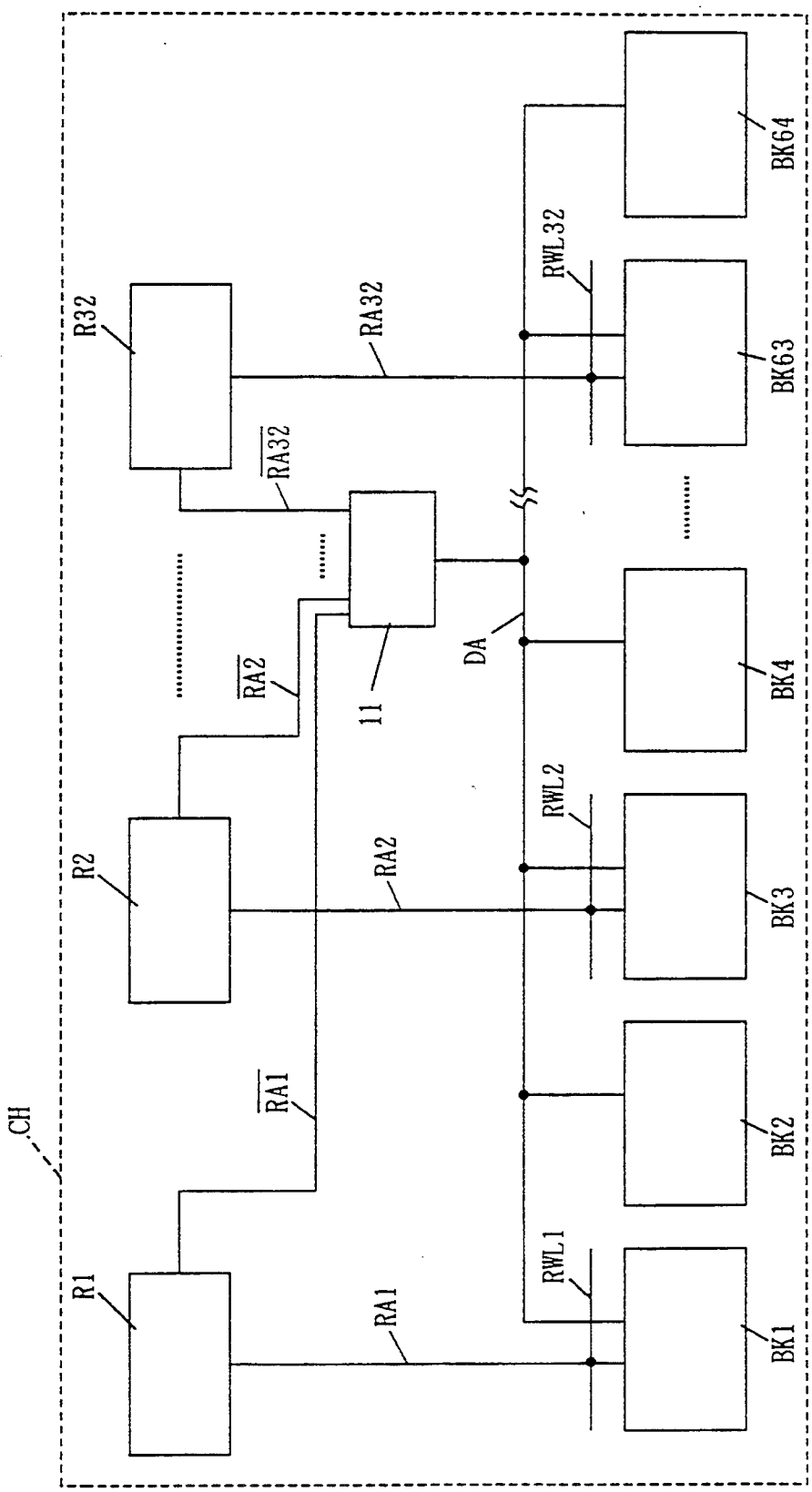
FIG. 4 is a block diagram showing structure of a semiconductor memory device including a redundancy circuit according to another embodiment of the present invention.

FIG. 4 is a block diagram showing structure of a semiconductor memory device including a redundancy circuit according to another embodiment of the present invention.

This semiconductor memory device includes 64 memory blocks BK1-BK64, 32 substitution circuits R1-R32 and one normal memory cell nonselecting circuit 11. 32 redundancy word lines RWL1-RWL32 are provided corresponding to 32 substitution circuits R1-R32.

Each of the memory blocks BK1-BK64 has the same configuration as the memory block BKa shown in FIG. 1. Each of the substitution circuits R1-R32 has the same configuration as the substitution circuit 10a shown in FIG. 1. The normal memory cell nonselecting circuit 11 has the same configuration as the normal memory cell nonselecting circuit 11 shown in FIG. 1.

A redundancy word line activating signal RA1 output from an inverter (see FIG. 1) included in the substitution circuit R1 is applied to the redundancy word line RWL1 and the memory block BK1. A redundancy word line activating signal RA2 output from an inverter (see FIG. 1) included in the substitution circuit R2 is applied to the redundancy word line RWL2 and the memory block BK3. Similarly, a redundancy word line activating signal RA32 output from an inverter (see FIG. 1) included in the substitution circuit R32 is applied to the redundancy word line RWL32 and the memory block BK63. Output signals $\overline{RA1}$-$\overline{RA32}$ of NAND circuits (see FIG. 1) included in the substitution circuits R1-R32 are applied to the normal memory cell nonselecting circuit 11. A decoder inactivating signal DA output from the normal memory cell nonselecting circuit 11 is applied to all the memory blocks BK1-BK64.

When any of the redundancy word lines RWL1-RWL32 are not used, all the redundancy word line activating signals RA1-RA32 attain a logic low level, and the decoder inactivating signal DA attains a logic high level. Accordingly, decoders included in all the memory blocks BK1-BK64 are not rendered inactive.

When any of the redundancy word lines RWL1-RWL32 is used, any of the redundancy word line activating signals RA1-RA32 attains a logic high level. When the redundancy word line RWL1 is used, for example, the redundancy word line activating signal RA1 attains a logic high level.

An X address and a Z address (substitute address) of a word line to be substituted is programmed into a substitute address program circuit (see FIG. 1) included in each substitution circuit. An address of a word line in an arbitrary memory block can be programmed into each substitute address program circuit. For example, an address of a word line in the memory block BK4 can be programmed into the substitute address program circuit in the substitution circuit R1. In that case, the word line in the memory block BK4 can be substituted by the redundancy word line RWL1.

When the word line in the memory block BK4 is substituted by the redundancy word line RWL1, the decoder inactivating signal DA attains a logic low level. As a result, the decoders included in all the memory blocks BK1-BK64 are rendered inactive.

In such a manner, the word line in each memory block can be substituted by an arbitrary redundancy word line, and the decoder inactivating signal DA renders all the memory blocks BK1-BK64 inactive at the time of selection of the redundancy word line. Thus, the number of substitution circuits and the number of redundancy word lines need not correspond to the number of memory blocks. In the semiconductor memory device having a large number of memory blocks, i.e., 32 to 128 memory blocks, the number of redundancy word lines and substitution circuits can be reduced in order to reduce a circuit scale and a chip area.

Figure 5:
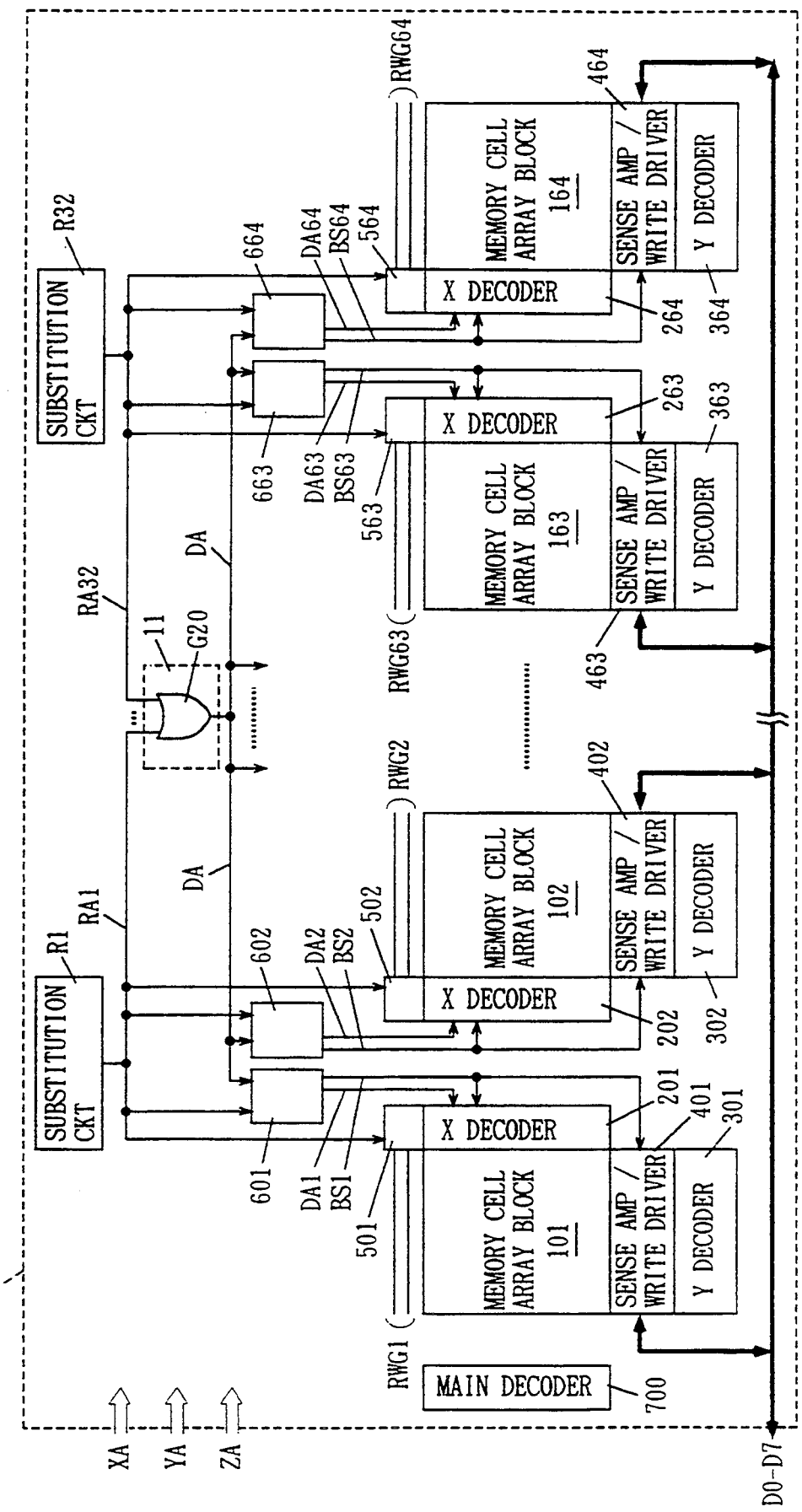
FIG. 5 is a block diagram showing structure of a semiconductor memory device including a redundancy circuit according to still another embodiment of the present invention.

FIG. 5 is a block diagram showing structure of a semiconductor memory device including a redundancy circuit according to still another embodiment of the present invention.

This semiconductor memory device includes 64 memory cell array blocks 101-164, 32 substitution circuits R1-R32 and one normal memory cell nonselecting circuit 11. The semiconductor memory device is formed on a chip CH.

X decoders 201-264, Y decoders 301-364, sense amplifier/write drivers 401-464, redundancy decoders 501-564 and block selectors 601-664 are provided corresponding to the memory cell array blocks 101-164. Further, redundancy word line groups RWG1-RWG64 are provided corresponding to the memory cell array blocks 101-164. A main decoder 700 is further provided.

Each of the memory cell array blocks 101-164 includes 512 word lines, 64 bit line pairs, and a plurality of static memory cells provided at intersections of the word lines and the bit line pairs.

The main decoder 700 decodes an externally applied X address signal XA and applies the decoded signal to the X decoders 201-264. The block selectors 601-664 respond to an externally applied Z address signal (block address signal) ZA to generate block selecting signals BS1-BS64, respectively. Each of the X decoders 201-264 responds to its corresponding block selecting signal and an output signal of the main decoder 700 to select one word line in its corresponding memory cell array block. Each of the Y decoders 301-364 responds to an externally applied Y address signal YA to select 8 bit line pairs in its corresponding memory cell array block.

The X address signal XA includes X address signals X0-X9. The Y address signal YA includes Y address signals Y0-Y2. The Z address signal ZA includes Z address signals Z0-Z5.

A redundancy word line activating signal output from each substitution circuit is applied to two redundancy decoders and two block selectors. For example, a redundancy word line activating signal RA1 output from the substitution circuit R1 is applied to the redundancy decoders 501 and 502 and the block selectors 601 and 602. A redundancy word line activating signal RA32 output from the substitution circuit R32 is applied to the redundancy decoders 563 and 564 and the block selectors 663 and 664.

The redundancy word line activating signals RA1-RA32 output from all the substitution circuits R1-R32 are applied to the normal memory cell nonselecting circuit 11.

The normal memory cell nonselecting circuit 11 includes an OR circuit G20. A decoder inactivating signal DA output from the normal memory cell nonselecting circuit 11 is applied to all the block selectors 601-664. The block selectors 601-664 apply decoder activating signals DA1-DA64 to the X decoders 201-264.

An operation of the semiconductor memory device of FIG. 5 will now be described.

When none of the redundancy word line groups RWG1-RWG64 are used (the redundancy nonselecting time), the redundancy word line activating signals RA1-RA32 are at a logic low level. Accordingly, the decoder inactivating signal DA output from the normal memory cell nonselecting circuit 11 attains a logic low level. This renders the block selectors 601-604 active. At that time, all the redundancy decoders 501-564 are brought into a nonselecting state, and all the decoder activating signals DA1-DA64 are rendered active.

One of the block selecting signals BS1-BS64 attains a logic high level (a selecting state) in response to the Z address signal ZA. For example, if the block selecting signal BS1 attains a logic high level, then the X decoder 201 is brought into a selecting state and the sense amplifier/write driver 401 is rendered active. The X decoder 201 selects one word line in the memory cell array block 101 to raise its potential to a logic high level. Accordingly, data are read from 64 memory cells connected to the selected word line onto their corresponding bit line pairs. The Y decoder 301 selects 8 bit line pairs in the memory cell array block 101.

In a reading operation, sense amplifiers in the sense amplifier/write driver 401 are activated. Accordingly, data on the selected 8 bit line pairs are amplified by the sense amplifiers and output as data D0-D7.

In a writing operation, write drivers in the sense amplifier/write driver 401 are activated. Accordingly, externally applied data D0-D7 are written into the selected 8 bit line pairs.

When any redundancy word line of the redundancy word line groups RWG1-RWG64 is used (the redundancy selecting time), one of the redundancy word line activating signals RA1-RA32 attains a logic high level. For example, assuming that one redundancy word line in the redundancy word line group RWG1 is used, an output signal of the redundancy selecting circuit in the substitution circuit R1 attains a logic high level.

An address of a word line to be substituted (substitute address) is programmed in advance into the substitute address program circuit in the substitution circuit R1. The address that can be programmed into the substitute address program circuit in the substitution circuit R1 is not limited to the address of a word line in the memory cell array block 101. Addresses of word lines in other memory cell array blocks 102-164 can also be programmed into the substitute address program circuit in the substitution circuit R1.

When the address designated by the X address signal XA and the Z address signal ZA does not match the substitute address programmed into the substitute address program circuit in the substitution circuit R1, the redundancy word line activating signal RA1 attains a logic low level and the decoder inactivating signal DA also attains a logic low level. In that case, any of the word lines in one memory cell array is selected by the same operation as that at the redundancy nonselecting time.

When the address designated by the X address signal XA and the Z address signal ZA matches the substitute address programmed into the substitute address program circuit in the substitution circuit R1, the redundancy word line activating signal RA1 attains a logic high level and the decoder inactivating signal DA also attains a logic high level.

At the selection of the memory cell array block 101, the least significant Z address signal Z0 attains a logic low level. In this case, the block selecting signal BS1 attains a logic high level, and the block selecting signals BS2-BS64 attain a logic low level. This renders the sense amplifier/write driver 401 active and the sense amplifier/write drivers 402-464 inactive. The X decoders 202-264 are brought into a nonselection state. At this time, the decoder activating signal DA1 attains a logic low level. This also brings the X decoder 201 in a nonselection state.

Since the redundancy word line activating signal RA1 is at a logic high level, the redundancy decoders 501 and 502 are rendered active. When the least significant Z address signal Z0 is at a logic low level, the redundancy decoders 501 and 502 are brought into a selecting state and a nonselecting state, respectively. Accordingly, one of the redundancy word lines of the redundancy word line group RWG1 is selected in response to the least significant X address signal X0, so that its potential attains a logic high level. Accordingly, data are read from 64 memory cells connected to the selected redundancy word line onto their corresponding bit line pairs. The Y decoder 301 selects 8 bit line pairs in the memory cell array block 101.

In the reading operation, the sense amplifiers in the sense amplifier/write driver 401 are activated. Accordingly, data on the selected 8 bit line pairs are amplified by the sense amplifiers and output as data D0-D7.

In the writing operation, the write drivers in the sense amplifier/write driver 401 are activated. Accordingly, externally applied data D0-D7 are written into the selected 8 bit line pairs.

In such a manner, a word line in each memory cell array block can be substituted by an arbitrary word line, and all the X decoders 201-264 are rendered inactive at the time of selection of the redundancy word line. Thus, the number of substitution circuits need not correspond to the number of memory cell arrays.

As in this embodiment, in the semiconductor memory device having a large number of memory cell array blocks, it is possible to reduce the number of substitution circuits in order to reduce a circuit scale and a chip area.

Figure 6:
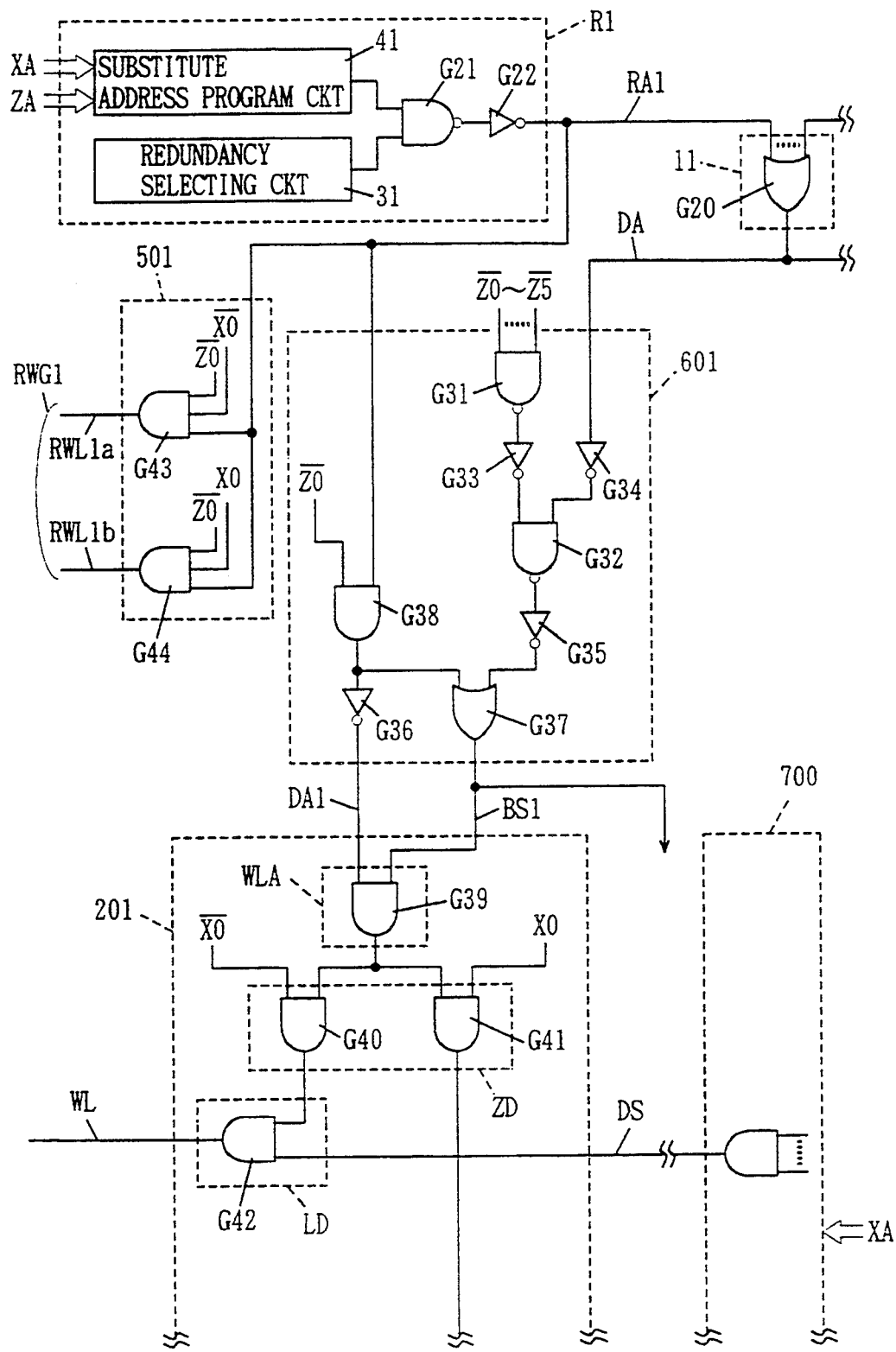
FIG. 6 is a circuit diagram showing a detailed structure of a portion of the semiconductor memory device of FIG. 5.

FIG. 6 is a circuit diagram showing in detail structure of a part of the semiconductor memory device of FIG. 5. Portions relating to the memory cell array block 101 are mainly shown in FIG. 6.

The substitution circuit R1 includes a redundancy selecting circuit 31, a substitute address program circuit 41, a NAND circuit G21 and an inverter G22. A substitute address comprised of an X address except a least significant bit and a Z address except a least significant bit is programmed in advance into the substitute address program circuit 41. Further, an X address signal XA except a least significant bit and a Z address signal ZA except a least significant bit are applied to the substitute address program circuit 41.

The block selector 601 includes NAND circuits G31 and G32, inverters G33-G36, an OR circuit G37 and an AND circuit G38. The NAND circuit G31 is supplied with Z address signals Z0-Z5. One of input terminals of the AND circuit G38 is supplied with the Z address signal Z0.

The redundancy word line group RWG1 includes redundancy word lines RWL1a and RWL1b. The redundancy decoder 501 includes two AND circuits G43 and G44 in correspondence with the redundancy word lines RWL1a and RWL1b. The AND circuit G43 has one of input terminals supplied with the Z address signal Z0, another input terminal with an X address signal Z0 and the remaining input terminal with the redundancy word line activating signal RA1. The AND circuit G44 has one of input terminals supplied with the Z address signal Z0, another input terminal with the X address signal X0 and the remaining input terminal with the redundancy word line activating signal RA1.

The AND circuit G39 has one input terminal supplied with the block selecting signal BS1 and the other input terminal with the decoder activating signal DA1. The AND circuit G39 constitutes a word line activating signal generating circuit WLA. The AND circuit G40 has one input terminal supplied with the X address signal X0. The AND circuit G41 has one input terminal supplied with the X address signal X0. An output signal of the AND circuit G39 is applied to the other input terminal of the AND circuit G40 and the other input terminal of the AND circuit G41. The AND circuits G41 and G42 constitute a Z decoder ZD.

The AND circuit G42 has one input terminal supplied with an output signal of the AND circuit G40 and the other input terminal with an output signal DS of the main decoder 700. An output signal of the AND circuit G42 is applied to a word line WL. The AND circuit G42 constitutes a local decoder LD.

Only one local decoder LD and one word line WL are shown in FIG. 6. An X address signal XA except a least significant bit is applied to the main decoder 700.

When the redundancy word line RWL1a is used, an output of the redundancy selecting circuit 31 is set at a logic high level. An X address and Z address of a word line to be substituted by the redundancy word line RWL1a are programmed in advance as a substitute address into the substitute address program circuit 41. In the example of FIG. 6, the least significant bit of the X address is not programmed.

If the address designated by an externally applied X address signal XA (except the least significant bit) and Z address signal ZA (except the least significant bit) matches the substitute address programmed into the substitute address program circuit 41, then an output of the substitute address program circuit 41 attains a logic high level. Accordingly, the redundancy word line activating signal RA1 attains a logic high level, and the decoder inactivating signal DA also attains a logic high level. Thus, an output of the inverter G35 attains a logic low level.

The Z address signal Z0-Z5 attain a logic high level at the time of selection of the add number of memory cell array blocks 101, 103, . . . 163. Accordingly, an output of the AND circuit G38 attains a logic high level and the block selecting signal BS1 attains a logic high level (selecting state). Thus, the sense amplifier/write driver 401 (see FIG. 5) is activated.

At that time, since the decoder activating signal DA1 attains a logic low level, an output of the AND circuit G39 attains a logic low level and outputs of the AND circuits G40 and G41 also attain a logic low level (nonselecting state). Accordingly, an output of the AND circuit G42 also attains a logic low level, and the word line WL remains to be in a nonselecting state.

Since the redundancy word line activating signal RA1 is at a logic high level, if the X address signal X0 and Z address signal Z0 are at a logic high level, then an output of the AND circuit G43 attains a logic high level. Thus, the redundancy word line RWL1a is put in a selecting state.

When any word line in the redundancy word line groups RWG1 and RWG2 (see FIG. 5) is not selected, or when the address designated by the externally applied X address signal XA and the Z address signal ZA does not match the substitute address, the redundancy word line activating signal RA1 attains a logic low level.

In that case, the outputs of the AND circuits G43 and G44 in the redundancy decoder 501 both attain a logic low level, and both the redundancy word lines RWL1a and RWL1b are brought into a nonselecting state. The output of the AND circuit G38 attains a logic low level and the decoder activating signal DA1 attains a logic high level.

If all other redundancy word line activating signals RA2-RA32 (see FIG. 5) are at a logic low level, then the decoder inactivating signal DA attains a logic low level. At the time of selection of the memory cell array 101, the Z address signals Z0-Z5 attain a logic high level. Accordingly, an output of the inverter G35 attains a logic high level. Thus, the block selecting signal BS1 attains a logic high level.

As a result, the sense amplifier/write driver 401 (FIG. 5) is rendered active. Further, the output of the AND circuit G39 attains a logic high level. When the X address signal X0 is at a logic high level, the output of the AND circuit 40 attains a logic high level. If the signal DS output from the main decoder 700 is at a logic high level, then the output of the AND circuit G42 attains a logic high level and the word line WL is brought into a selecting state.

If any of the redundancy word line activating signals R2-R32 (FIG. 5) is at a logic high level, then the decoder inactivating signal DA also attains a logic high level. In this case, the output of the inverter G35 attains a logic low level and the block selecting signal BS1 attains a logic low level.

Accordingly, the sense amplifier/write driver 401 is rendered inactive. Further, the output of the AND circuit G39 attains a logic low level. Thus, the outputs of the AND circuits G40 and G41 attain a logic low level, and the output of the AND circuit G42 also attains a logic low level. The word line WL is thus brought into a nonselecting state.

While the present invention is applied to the redundancy word lines in the foregoing embodiments, the present invention is similarly applicable to redundancy bit line pairs by substituting the redundancy bit line pairs for the redundancy word lines and Y decoders for the X decoders.

In addition, the present invention is not limited to a static random access memory and is also applicable to a dynamic random access memory and other numerous semiconductor memory devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of memory cell array blocks, each including a plurality of selecting lines and a plurality of memory cells connected to said plurality of selecting lines;
   a plurality of first selecting means provided corresponding to said plurality of memory cell array blocks, for each selecting any of the plurality of selecting lines in a corresponding one of said memory cell array blocks;
   a plurality of redundant selecting lines provided corresponding to said plurality of memory cell array blocks;
   a plurality of redundant memory cells connected to said plurality of redundant selecting lines;
   a plurality of redundant circuit means each corresponding to one or a number of said plurality of redundant selecting lines,
   each of said plurality of redundant circuit means including setting means in which information as to whether or not the corresponding one or number of said plurality of redundant selecting lines being used is set in advance, program means in which an address of a selecting liner in any of said plurality of memory cell array blocks to be substituted by the corresponding one or number of said plurality of redundant selecting lines can be programmed, and second selecting means responsive to outputs of said setting means and said program means for selecting the corresponding one or number of said plurality of redundant selecting lines; and
   inactivating means responsive to outputs of said plurality of redundant circuit means for inactivating said plurality of first selecting means when one or a number said plurality of redundant selecting lines are selected by any of said plurality of redundant circuit means.

2. The semiconductor memory device according to claim 1, wherein
   each said second selecting means generates a redundant selecting line activating signal for selecting the corresponding one or number of said plurality of redundant selecting lines when use of one of said plurality of redundant selecting lines is set in said setting means and an address designated by an externally applied address signal matches with an address programmed into said program means.

3. The semiconductor memory device according to claim 2, wherein
   said inactivating means includes:
   logic gate means for generating an inactivating signal for inactivating said plurality of first selecting means when said redundant selecting line activating signal is generated from any of said plurality of redundant circuit means.

4. The semiconductor memory device according to claim 3, further comprising:
   block selecting means for selectively generating a plurality of block selecting signals for selecting said plurality of first selecting means, respectively,
   said block selecting means being rendered inactive in response to said inactivating signal from said inactivating means.

5. The semiconductor memory device according to claim 4, wherein
   said block selecting means includes:
   a plurality of block selectors corresponding to said plurality of memory cell array blocks,
   each of said plurality of block selectors generating a block selecting signal for bringing a corresponding one of said first selecting means into a selecting state in response to an externally applied block address signal.

6. The semiconductor memory device according to claim 5, further comprising:
   a plurality of sense amplifier means provided corresponding to said plurality of memory cell array blocks, for each amplifying data read from memory cells connected to a selected selecting line in a corresponding one of said memory cell array blocks or from memory cells connected to a corresponding redundant selecting line, wherein
   said block selecting means responds to said plurality of redundant selecting line activating signals and said inactivating signal to activate sense amplifier means corresponding to a selected memory cell array block or a selected redundant selecting line at the time of a reading operation.

7. The semiconductor memory device according to claim 6, further comprising:
   a plurality of writing means provided corresponding to said plurality of memory cell array blocks, for each writing data into memory cells connected to a selected selecting line in a corresponding memory cell array block or into memory cells connected to a corresponding redundant selecting line, wherein
   said block selecting means responds to said plurality of redundant selecting line activating signals and said inactivating signal to activate writing means corresponding to a selected memory cell array block or a selected redundant selecting line at the time of a writing operation.

8. The semiconductor memory device according to claim 3, wherein
said plurality of first selecting means are rendered inactive in response to said inactivating signal from said inactivating means.

9. The semiconductor memory device according to claim 8, further comprising:
block selecting means for generating a plurality of block selecting signals for selecting a plurality of memory cell array blocks, respectively;
a plurality of sense amplifier means provided corresponding to said plurality of memory cell array blocks, for each amplifying data read from memory cells connected to a selected selecting line in a corresponding one of said memory cell array blocks or from memory cells connected to a corresponding one of said redundant selecting lines; and
a plurality of activating means provided corresponding to said plurality of memory cell array blocks for each activating a corresponding one of said sense amplifier means,
each of said plurality of activating-means activating or inactivating a corresponding one of said sense amplifier means in response to a corresponding one of said block selecting signals, a corresponding one of said redundant selecting line activating signals and said inactivating signal at the time of a reading operation.

10. The semiconductor memory device according to claim 9, further comprising:
a plurality of writing means provided corresponding to said plurality of memory cell array blocks, for each writing externally applied data into a corresponding one of said memory cell array blocks or a corresponding redundant selecting line, wherein
each of said plurality of activating means activates or inactivates a corresponding one of said sense amplifier means in response to a corresponding one of said block selecting signals, a corresponding one of said redundant selecting line activating signals and said inactivating signal at the time of a writing operation.

11. The semiconductor memory device according to claim 10, wherein
each of said plurality of activating means includes:
first transfer gate means for outputting as an activating signal a signal responsive to a redundant selecting line activating signal when said inactivating signal is rendered active, and
second transfer gate means for outputting as an activating signal a signal responsive to a corresponding block selecting signal when said inactivating signal is rendered inactive.

12. A semiconductor memory device, comprising:
a plurality of memory cell array blocks each including a plurality of selecting lines and a plurality of memory cells connected to said plurality of selecting lines;
a plurality of first selecting means provided corresponding to said plurality of memory cell array blocks, for each selecting any of the plurality of selecting lines in a corresponding one of said memory cell array blocks;
a plurality of redundant selecting lines provided corresponding to said plurality of memory cell array blocks;
a plurality of redundant memory cells connected to said plurality of redundant selecting lines;
a plurality of redundant circuit means each corresponding to a number of said plurality of redundant selecting lines,
said plurality of redundant circuit means being smaller in number than said plurality of memory cell array blocks,
each of said plurality of redundant circuit means including setting means in which information as to whether or not the corresponding number of said plurality of redundant selecting lines are used is set in advance, program means in which an address of a selecting line in any of said plurality of memory cell array blocks to be substituted by the corresponding number of said plurality of redundant selecting lines can be programmed, and second selecting means responsive to outputs of said setting means and said program means for selecting the corresponding number of said plurality of redundant selecting lines;
inactivating means responsive to outputs of said plurality of redundant circuit means for inactivating said plurality of first selecting means when a number of said plurality of redundant selecting lines are selected by any of said plurality of redundant circuit means; and
third selecting means for selecting one of said number of the plurality of redundant selecting lines selected by each said second selecting means.

13. A method of operating a semiconductor memory device comprising:
a plurality of memory cell array blocks each including a plurality of selecting lines and a plurality of memory cells connected to said plurality of selecting lines;
a plurality of first selecting means provided corresponding to said plurality of memory cell array blocks, for each selecting any of a plurality of selecting lines in a corresponding one of said memory cell array blocks;
a plurality of redundant selecting lines provided corresponding to said plurality of memory cell array blocks;
a plurality of redundant memory cells connected to said plurality of redundant selecting lines; and
a plurality of redundant circuit means each corresponding to one or a number of said plurality of redundant selecting lines,
each of said plurality of redundant circuit means including setting means in which information as to whether or not the corresponding one or number of said plurality of redundant selecting lines being used is set in advance and program means in which an address of a selecting line in any of said plurality of memory cell array blocks to be substituted by the corresponding one or number of said plurality of redundant selecting lines can be programmed, said method comprising the steps of:
selecting the corresponding one or number of said plurality of redundant selecting lines in response to outputs of said setting means and said program means in each of said plurality of redundant circuit means; and
inactivating said plurality of first selecting means in response to outputs of said plurality of redundant circuit means when one or a number of said plurality of redundant selecting lines are selected by any of said plurality of redundant circuit means.

14. A semiconductor memory device, comprising:

a plurality of memory cell array blocks each including a plurality of selecting lines and a plurality of memory cells connected to said plurality of selecting lines;

a plurality of first selecting means provided corresponding to said plurality of memory cell array blocks, for each selecting any of the plurality of selecting lines in a corresponding one of said memory cell array blocks;

a plurality of redundant selecting lines provided corresponding to said plurality of memory cell array blocks;

a plurality of redundant memory cells connected to said plurality of redundant selecting lines;

a plurality of redundant circuit means each corresponding to a number of said plurality of redundant selecting lines, said plurality of redundant circuit means being smaller in number than said plurality of memory cell array blocks, each of said plurality of redundant circuit means including setting means in which information as to whether or not the corresponding number of said plurality of redundant selecting lines are used is set in advance, program means in which an address of a selecting line in any of said plurality of memory cell array blocks to be substituted by the corresponding number of said plurality of redundant selecting lines can be programmed, and second selecting means responsive to outputs of said setting means and said program means for selecting the corresponding number of said plurality of redundant selecting lines; and inactivating means responsive to outputs of said plurality of redundant circuit means for inactivating said plurality of first selecting means when a number of said plurality of redundant selecting lines are selected by any of said plurality of redundant circuit means.

* * * * *